United States Patent [19]

Mistretta et al.

[11] Patent Number: 5,031,624
[45] Date of Patent: Jul. 16, 1991

[54] PHASE CONTRAST, LINE-SCANNED METHOD FOR NMR ANGIOGRAPHY

[75] Inventors: Charles A. Mistretta; Frank R. Korosec, both of Madison, Wis.

[73] Assignee: Wisconsin Alumni Research Foundation, Madison, Wis.

[21] Appl. No.: 568,938

[22] Filed: Aug. 17, 1990

[51] Int. Cl.$^5$ ............................................. A61B 5/055
[52] U.S. Cl. ............................. 128/653 AF; 324/306
[58] Field of Search .................... 128/653 A, 653 AF; 324/326, 309

[56] References Cited

U.S. PATENT DOCUMENTS 4,714,081 12/1987 Dumoulin et al. ........... 128/653 AF
4,718,424 1/1988 Nishimura .................... 128/653 AF

OTHER PUBLICATIONS

Redpath et al., "A New Method of NMR Flow Imaging", Phys. Med. Biol., 1984, vol. 29, No. 7, pp. 891–895.

Primary Examiner—Ruth S. Smith
Attorney, Agent, or Firm—Quarles & Brady

[57] ABSTRACT

An NMR angiogram is produced using a line scan data acquisition. Each line of NMR data is acquired twice, once with a velocity sensitizing gradient having a positive first moment and once with a velocity sensitizing gradient having a negative first moment. The two signals from the acquisition are subtracted to cancel signals from stationary spins while enhancing signals from flowing spins. The magnitude of the velocity sensitizing gradient moment is changed during the cardiac cycle so that aliasing does not occur at high blood velocities and the signal strength does not drop too low at low blood velocities. An angiogram is produced by reconstructing an image from line scan data acquired from a series of slices.

7 Claims, 6 Drawing Sheets

PHASE CONTRAST, LINE-SCANNED METHOD FOR NMR ANGIOGRAPHY

BACKGROUND OF THE INVENTION

The field of the invention is nuclear magnetic resonance (NMR) techniques for producing angiograms.

Any nucleus which possesses a magnetic moment attempts to align itself with the direction of the magnetic field in which it is located. In doing so, however, the nucleus precesses around this direction at a characteristic angular frequency (Larmor Frequency) which is dependent on the strength of the magnetic field and on the properties of the specific nuclear species (the magnetogyric constant $\gamma$ of the nucleus).

When a substance such as human tissue is subjected to a uniform magnetic field (polarizing field $B_0$), the individual magnetic moments of the paramagnetic nuclei in the tissue attempt to align with this field, but precess about it in random order at their characteristic Larmor frequency. A net magnetic moment $M_z$ is produced in the direction of the polarizing field, but the randomly oriented components in the perpendicular plane (x-y plane) cancel one another. If, however, the substance, or tissue, is irradiated with a magnetic field (RF excitation field $B_1$) which is in the x-y plane and which is near the Larmor frequency, the net aligned moment $M_z$ can be rotated into the x-y plane to produce a net transverse magnetic moment $M_1$ which is rotating in the x-y plane at the Larmor frequency.

The practical value of this gyromagnetic phenomena resides in the radio signal which is emitted after the RF excitation signal is terminated. When the excitation signal is removed, an oscillating sine wave is induced in a receiving coil by the rotating field produced by the transverse magnetic moment $M_1$. The frequency of this signal is the Larmor frequency, and its initial amplitude, $A_0$, is determined by the magnitude of $M_1$.

The measurements described above are called "pulsed NMR measurements." They are divided into a period of excitation and a period of emission. As will be discussed in more detail below, this measurement cycle may be repeated many times to accumulate different data during each cycle or to make the same measurement at different locations in the subject.

Although NMR measurements are useful in many scientific and engineering fields, an important use is in the field of medicine. NMR measurements provide a contrast mechanism which is quite different from X-rays, and this enables difference between soft tissues to be observed with NMR which are completely indiscernible with X-rays. In addition, physiological differences can be observed with NMR measurements, whereas X-rays are limited particularly to anatomical studies.

For most medical applications utilizing NMR, an imaging technique must be employed to obtain information at specific locations in the subject. The foremost NMR imaging technique is referred to as "zeugmatography" and was first proposed by P. C. Lauterbur in a publication "Image Formation by Induced Local Interactions: Examples Employing Nuclear Magnetic Resonance", *Nature* Vol. 242, Mar. 16, 1973, pp. 190-191. Zeugmatography employs one or more additional magnetic fields which have the same direction as the polarizing field $B_0$, but which have a nonzero gradient. By varying the strength (G) of these gradients, the net strength of the polarizing field $B_0 = B_z + G_x X + G_y Y + G_z Z$ at any location can be varied. As a result, if the frequency response of the receiver coil and circuitry is narrowed to respond to a single frequency $\omega_0$, then gyromagnetic phenomena will be observed only at a location where the net polarizing field $B_0$ is of the proper strength to satisfy the Larmor equation; $\omega_0 = \gamma B_0$: where $\omega_0$ is the Larmor frequency at that location.

By "linking" the resulting NMR signal with the strengths of the gradients ($G = G_x$, $G_y$, $G_z$) at the moment the signal is generated, the NMR signal is "tagged", or "sensitized", with position information. Such position sensitizing of the NMR signal enables an NMR image to be reconstructed from a series of measurements. Such NMR imaging methods have been classified as point methods, line methods, plane methods and three dimensional methods. These are discussed, for example, by P. Mansfield and P. G. Morris in their book *NMR Imaging in Biomedicine* published in 1982 by Academic Press, New York.

The NMR scanners which implement these techniques are constructed in a variety of sizes. Small, specially designed machines are employed to examine laboratory animals or to provide images of specific parts of the human body. On the other hand, "whole body" NMR scanners are sufficiently large to receive an entire human body and produce an image of any portion thereof.

An angiogram is a visualization of blood vessels. Traditionally, angiograms are produced by injecting the patient with a radiopaque substance and then taking an X-ray of the patient from the desired projection angle. The radiopaque substance flowing in the blood vessels is opaque to the X-rays, and the cardiovascular system appears brighter than the surrounding tissues in the resulting image. While high resolution angiograms may be produced with this conventional method, the patient is subjected to ionizing radiation.

Two methods have been used to produce angiograms by exploiting the NMR phenomenon. One of these is referred to as the "time of flight" or "inflow enhancement" method for contrasting flowing spins from the surrounding stationary spins, and the other is referred to as the "phase contrast" method.

Inflow enhancement occurs when unsaturated spins flow into a slice which has been excited by many radiofrequency (RF) pulses. If the time between RF pulses is much shorter than the $T_1$ relaxation rate of the tissues, the longitudinal magnetization does not have time to recover before the next RF pulse is applied. This results in reduced transverse magnetization and reduced signal when the magnetization is again tipped into the transverse plane by the next RF excitation pulse. The inflowing blood, on the other hand, will have seen no prior RF pulses and will therefore have a large longitudinal component of magnetization, which produces a larger transverse magnetization and a larger NMR signal. As a result, the flowing blood appears brighter in the reconstructed image.

In order to produce an angiogram, using the time-of-flight method, a series of contiguous thin slices oriented perpendicular to the direction of primary blood flow is collected. The slices can be collected sequentially in a 2D fashion or simultaneously in a 3D fashion. If 3D acquisition is used, the slice must be on the order of a few centimeters thick and the flip angle of the excitation pulses must be reduced. These measures are necessary to prevent saturation of the blood as it traverses the slice. Once the NMR data from the slices is collected, a projection is produced using a ray tracing technique. The most commonly used technique involves tracing a ray through the slice data and retaining the value of the most intense pixel encountered. The pixel associated with each ray is then mapped to its corresponding position in the projection image.

In phase contrast angiography, the mechanism for flow contrast is modulation of the phase of the transverse magnetization. The objective is to alter the phase of the NMR signal produced by the moving spins, while at the same time leaving the net phase of the NMR signal produced by the stationary spins unchanged. This result can be achieved through the use of a bipolar gradient waveform.

Figure 3A:
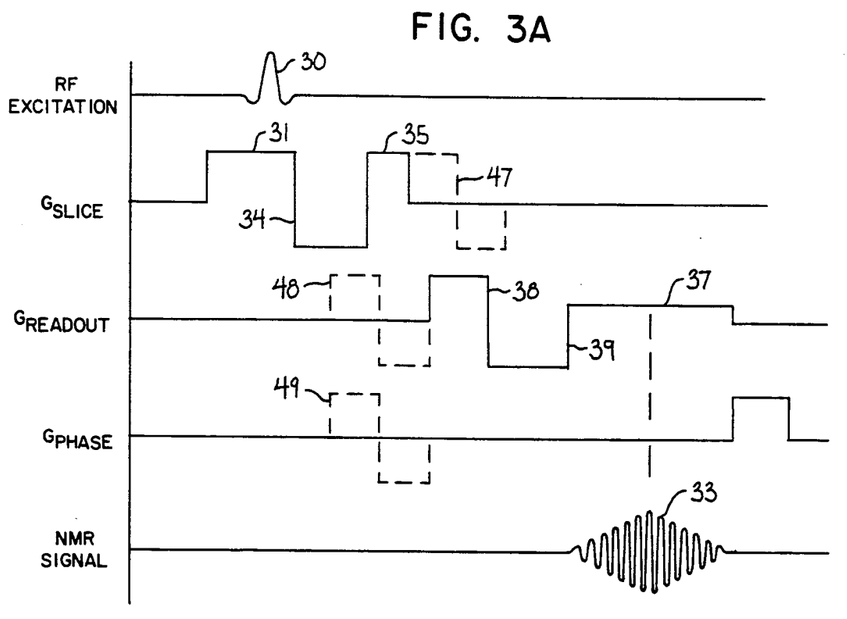
FIGS. 3A–3C is an NMR pulse sequence which is used to practice the present invention.
Figure 3B:
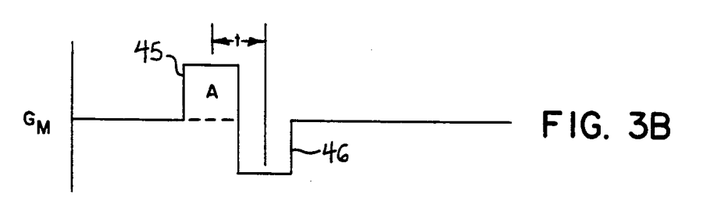

For a bipolar gradient waveform such as that shown in FIG. 3B, with first moment $M_1 = At$, it is well known that the NMR signal produced by a spin moving with velocity v along the axis containing the bipolar gradient will accumulate a phase given by the following equation:

$$\phi = \gamma M_1 v \tag{1}$$

where $\phi$ is the phase accumulation and $\gamma$ is the gyromagnetic constant of the spins.

Because stationary spins have velocity equal to zero, the phase change imparted to these spins will be zero. The sign of the phase change acquired by a moving spin is dependent on the sign of the amplitude of the lobes of the bipolar gradient. Therefore, if two excitation sequences are performed, each containing a bipolar gradient of opposite sign, each will impart equal but opposite phase shifts to the moving spin. Upon subtraction of the NMR data obtained using these two sequences, signal from stationary tissues will be cancelled whereas signal from moving spins will be reinforced to enhance the image.

As with the time of flight methods, phase contrast angiograms can be obtained using 2D or 3D acquisition schemes. Because with phase contrast techniques, the contrast does not rely solely on inflow phenomenon, a much larger volume is usually imaged in a single acquisition. In order to prevent saturation of the blood, a tip angle of approximately 30° is used. The smaller tip angle results in less blood signal than is obtainable with the 60° flip angle used in the time of flight technique, but because phase contrast is a subtraction method, the elimination of signals from stationary tissues makes the contrast associated with this technique far superior to that associated with the time of flight techniques.

The above described sequences work well in regions void of respiratory motion and vessel motion caused by cardiac pulsatility. However, when these techniques are applied to the abdomen or extremities where respiration and/or pulsatility are present, they yield images which are far from acceptable. One problem is image artifacts caused by the motion of spins. As indicated above, movement of the spins imparts a phase change to the NMR signal and this is indistinguishable from the phase imparted to the NMR signal due to the phase encoding gradient. As a result, when the image is reconstructed the position of the spins are misplaced in the phase encoding direction to produce ghosting or blurring in the image. A common solution to this problem is to employ respiratory or cardiac gating to the data acquisition procedure so that NMR data is acquired at times during the cycle when movement of the vessels is at a minimum.

Another problem with angiograms produced by the phase contrast method is that the image contrast varies as a function of blood velocity. Thus, NMR data acquired during the diastolic portion of the cardiac cycle when blood velocity is low will lack contrast. As a result, the blood vessels may not differ at all from the stationary background tissues. On the other hand, if the first moment $M_1$ of the bipolar gradient is increased to improve contrast at low velocities, then signal strength is lost at high blood velocities due to an excessive phase accumulation (i.e. aliasing). As a result, the angiogram will show parts of the vascular system very brightly and other parts will fade into the background. This problem is particularly acute at the extremities where blood velocity varies considerably during the cardiac cycle.

SUMMARY OF THE INVENTION

The present invention is an NMR method for producing an angiogram which employs the phase contrast technique and which is relatively insensitive to vessel movement and to variations in blood flow velocity. More particularly, the present invention includes: applying a slice select magnetic field gradient to the subject which is directed along a first axis; applying a selective RF excitation pulse to the subject to produce transverse magnetization in a plane perpendicular to the first axis; applying a bipolar motion sensitizing magnetic field gradient to the subject which has a moment M; acquiring an NMR signal from the subject while producing a readout magnetic field gradient along a second axis perpendicular to the first axis; repeating the above steps with a bipolar motion sensitizing magnetic field gradient that has a moment $-M$; subtracting the two acquired NMR signals and storing the resulting difference NMR signals as a row of data points in an array; repeating the above steps to acquire additional rows of data points from additional planes through the subject; Fourier transforming the rows of data points in the array; and producing an image in which the intensity of each pixel in the image is determined by a corresponding data point in the transformed array.

Another aspect of the invention is to vary the magnitude of the motion sensitizing magnetic field gradient moment M as a function of blood velocity. This is accomplished by producing a signal which is indicative of the phase of the subject's cardiac cycle; and stepping the moment M through a series of values in response to the cardiac phase signal such that the difference NMR signals are each acquired with a bipolar motion sensitizing magnetic field gradient having a moment M that changes in magnitude inversely as a function of blood flow rate.

A general object of the invention is to reduce motion artifacts in the reconstructed image due to the movement of vessels in the subject during data acquisition. No phase encoding gradient is used in the sequence, and hence, spins are not mispositioned by performing a Fourier transform in the phase encoding direction.

Another object of the invention is to shorten the scan time needed to produce an NMR angiogram. Because no phase encoding is used, it is not necessary to acquire a large number of NMR signals from the same slice. The use of the phase contrast method, which provides adequate contrast between the moving blood in the vessels and the surrounding stationary tissues permits rapid acqustion of data from the succession of slices with little regard to loss of signal due to saturation of the spins.

Yet another object of the invention is to optimize the phase contrast method of NMR angiography. By changing the motion sensitizing magnetic field gradient moment M as a function of the cardiac cycle phase, the sensitivity of the method can be maximized at all phases of the cardiac cycle. During diastole when blood flow is minimal, the moment M is increased to a value which produces large phase changes in the transversely magnetized spins. On the other hand, during systole when blood flow is maximum, the moment M is at a minimum so that the phase change will not be excessive and cause aliasing. The result is an NMR difference signal which is maximized throughout the cardiac cycle so that the cardio-vascular system can be easily seen at all times during the cycle.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
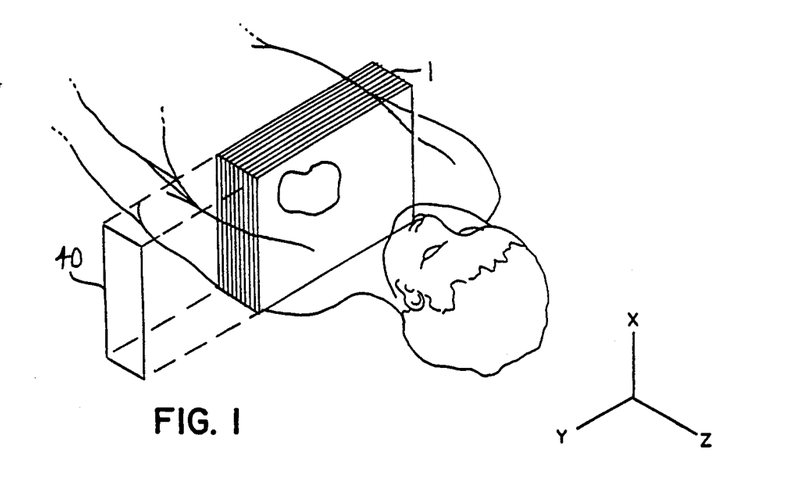
FIG. 1 is a pictoral view of a patient which shows an exemplary image that may be formed using the NMR method of the present invention.

Referring particularly to FIG. 1, the present invention is embodied in a full body NMR imaging system which is capable of receiving a patient and producing a two-dimensional image. The position and orientation of the image is determined by the magnitude of magnetic field gradients applied along the respective X, Y, and Z axes of the NMR imaging system. A set of slices 1 are shown in FIG. 1 which are taken through the patient's heart, although the magnetic field gradients can be controlled to produce an image through any section or volume and from any desired orientation.

Figure 2:
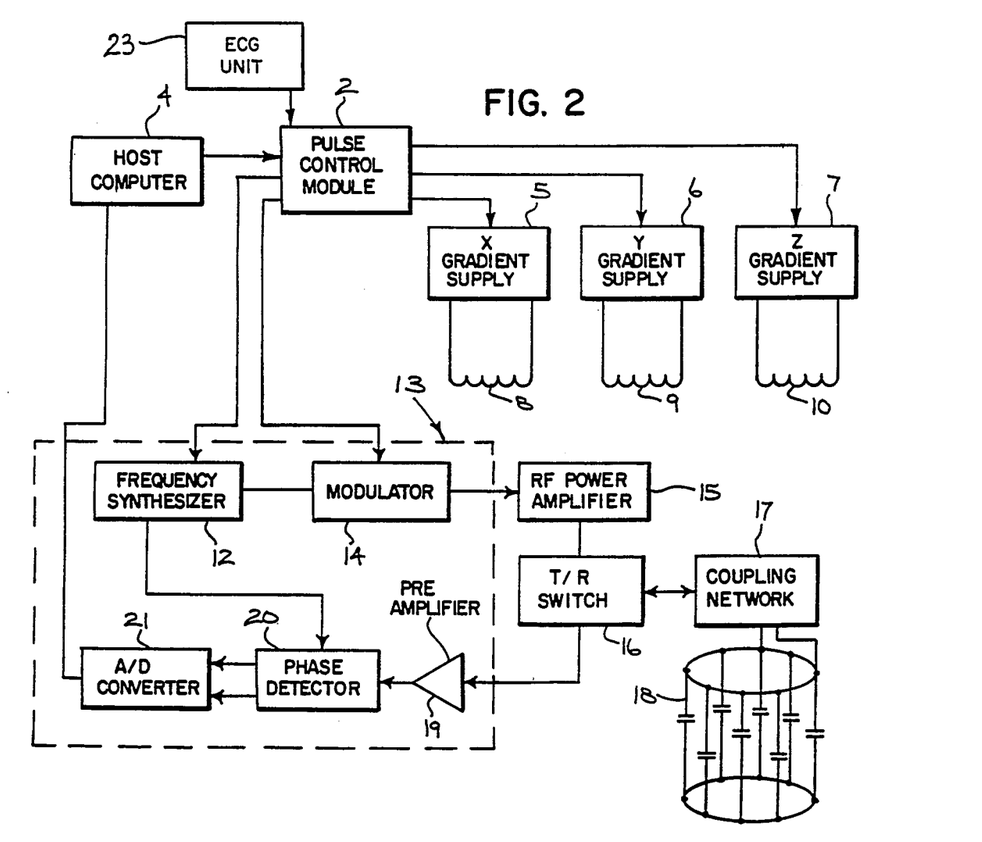
FIG. 2 is an electrical block diagram of an NMR system which employs the present invention.

The preferred embodiment of the invention has been incorporated in an NMR imaging system which is commercially available from the General Electric Company and is sold under the trademark "Signa". This system produces a 1.5 Tesla polarizing magnetic field $B_0$. FIG. 2 is a simplified block diagram of this NMR imaging system that includes a pulse control module 2 which receives command signals from a host computer 4. The pulse control module 2 provides properly timed pulse waveform signals to magnetic field gradient power supplies 5, 6 and 7 which energize respective gradient coils 8, 9 and 10 forming a part of a gradient coil assembly which surrounds the patient. The gradient coils 8, 9 and 10 produce the $G_x$, $G_y$ and $G_z$ magnetic fields in the direction of the polarizing magnetic field $B_0$, but with gradients directed in the x, y and z directions, respectively. The use of the $G_x$, $G_y$ and $G_z$ gradients in NMR imaging applications is well known in the art, and the specific use in the present invention will be described in more detail below.

Referring still to FIG. 2, the pulse control module 2 also provides activating pulses to an RF frequency synthesizer 12, which is part of an RF transceiver system which is indicated generally by dash-line 13. The pulse control module 2 also supplies modulating signals to a modulator 14 which modulates the output of the RF frequency synthesizer 12. The RF signals are applied through an RF power amplifier 15 and a transmit/receive switch 16 to a coupling network 17. The coupling network 17 produces two phase displaced RF signals which are applied to an excitation coil 18. The two phase displaced RF signals are applied to the coil 18 such that the RF excitation field $B_1$ produced by the coil 18 has two orthogonal components. Such a quadrature RF drive arrangement has been found to be a more efficient means for delivering the RF energy to the paramagnetic nuclei and, hence, a means for further shortening the duration of the RF pulses while still producing the required tip angle of the net magnetization.

Under the direction of the pulse control module 2, the center frequency and the modulation of the RF excitation pulses are controlled to produce the desired transverse excitation. The amplitude of the RF pulse determines the amount which the net magnetization is tipped. As will be described below, in the preferred embodiment of the invention tip angles from 10° to 90° are employed depending on slice thickness and blood velocity. In addition, the RF pulse is modulated and is used in combination with a magnetic field gradient, usually $G_z$, to excite spins in a selected plane, or slice, of the patient. The RF pulse bandwidth together with the slice selection gradient strength determine the slice thickness, and the center frequency of the RF pulse together with the strength of the slice select gradient determine the slice position. This slice select method using a "selective" RF pulse is described in U.S. Pat. No. 4,431,968, which issued on Feb. 4, 1984 and is entitled "Method of Three-Dimensional NMR Imaging Using Selective Excitation".

Referring to FIG. 2, the NMR signals from the excited nuclear spins are sensed by the RF coil 18 and applied through transmit/receive switch 16 to an RF preamplifier 19. The amplified NMR signals are applied to a quadrature phase detector 20 and the detected signals are digitized by A/D converter 21 and applied to computer 4 for storage and processing in a manner to be described below. A typical pulse sequence includes the application of one or more RF pulses to the coil 18 with the switch 16 set to transmit, followed by the receipt of one or more NMR signals with the switch 16 set to receive.

Figure 4:
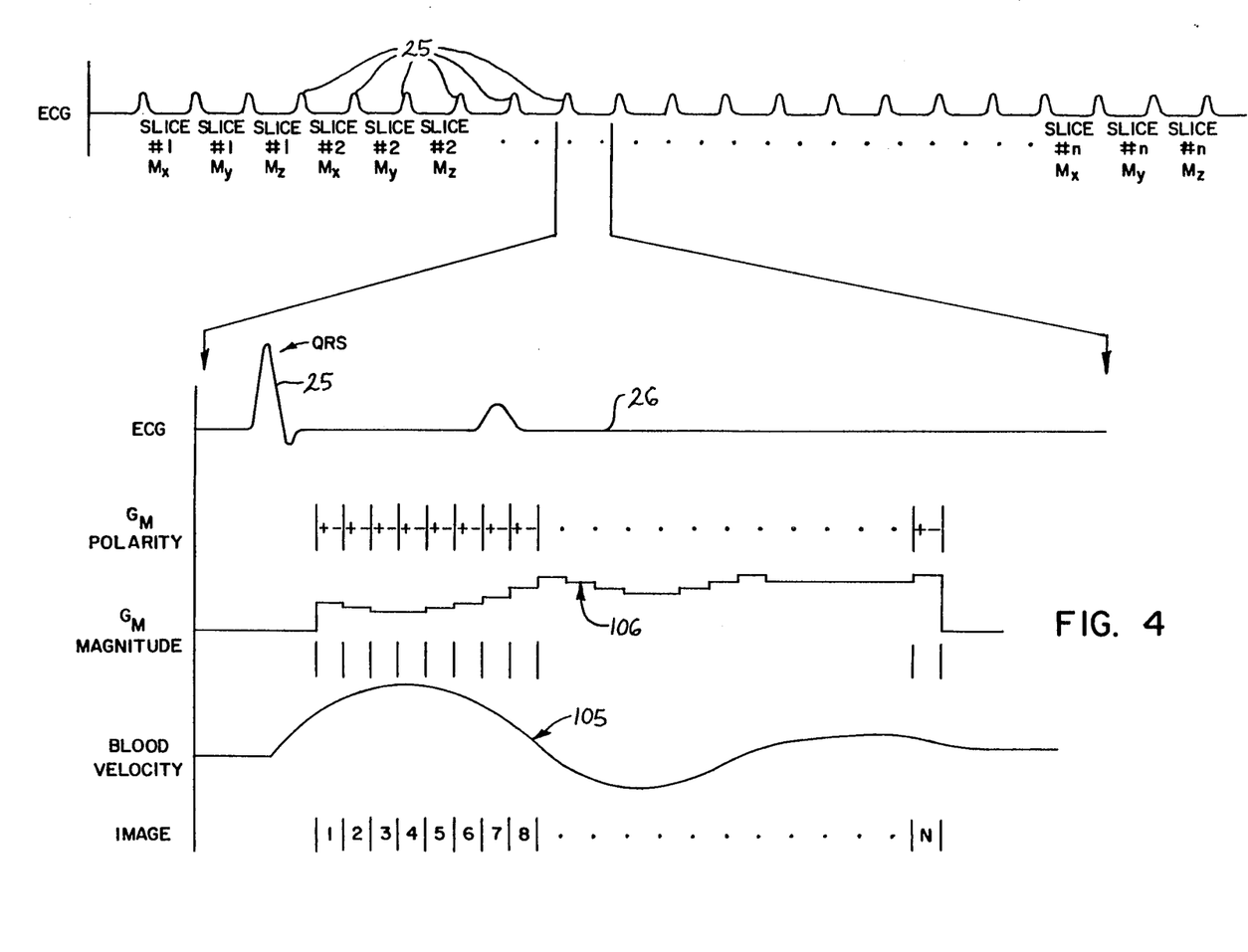
FIG. 4 is a graphic representation of the sequence in which NMR data is obtained using the present invention.

To monitor the patient's cardiac cycle, an ECG unit 23 is connected to the pulse control module 2 on the NMR system. The ECG unit 23 has electrodes (not shown) which attach to the patient and which sense the voltages produced during the cardiac cycle. One of these voltages is used to produce a pulse that is applied to the pulse control module 2 at the beginning of each cardiac cycle. This ECG input signal is shown in FIG. 4 as a series of QRS pulses 25 and the ECG input signal for one cardiac cycle is shown at 26. As will now be described in detail, the QRS pulse in the ECG signal 26 is used to trigger a series of pulse sequences used to acquire NMR data for a series of images.

Figure 3C:
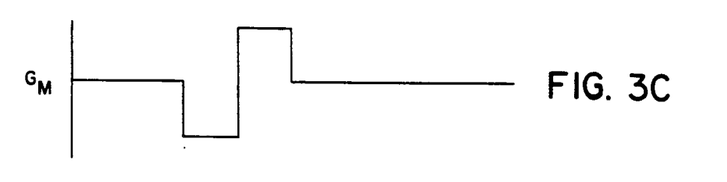

The pulse sequence used to acquire the NMR data is shown in FIGS. 3A-3C. It is a gradient echo sequence in which a selective RF excitation pulse 30 is applied to the subject in the presence of a slice select gradient pulse 31. In the preferred embodiment slices are selected along the z axis and the pulse 31 is produced by a $G_z$ gradient. The tip angle of the excitation pulse 30 has a value between $\alpha = 10°$ and $\alpha = 90°$ which is adjusted as a function of blood velocity. To compensate the NMR signal 33 which is produced after the excitation pulse 30 for phase shifts caused by the slice select gradient pulse 31 and to desensitize the NMR signal 33 to velocity along the slice select axis (z), a negative $G_z$ gradient pulse 34 followed by a positive $G_z$ gradient pulse 35 are produced by the $G_z$ gradient coils 10 as taught in U.S. Pat. No. 4,731,583. For example, a pulse 34 of the same width but opposite sign as the pulse 31 is used, and the pulse 35 has the same height, but one half the width of slice select pulse 31. More complex waveforms are also well known in the art for compensation of acceleration and higher orders of motion.

To position encode the NMR signal 33 along a readout axis (x), a readout gradient pulse 37 is produced as the NMR signal 33 is acquired. The readout gradient pulse 37 frequency encodes the NMR signal 33 in the well known manner such that the location of spins along the readout axis can be determined in the reconstructed image. The readout gradient pulse 37 remains at a constant value during the entire scan. To produce the gradient echo NMR signal 33 and to desensitize it to velocity along the readout axis, gradient pulses 38 and 39 precede the readout gradient pulse 37 as taught in U.S. Pat. No. 4,731,583.

Unlike the conventional gradient echo sequence used to acquire 2D or 3D NMR data, the pulse sequence of FIG. 3A does not employ phase encoding. As a result, only one pulse sequence, rather than a series of pulse sequences with different phase encoding need be executed. Of course, only a one dimensional (x axis) rather than a two dimensional (x and y axis) distribution of the spins can be reconstructed from this acquired NMR data. Referring again to FIG. 1, this means that an image coplanar with the slice 1 cannot be produced. Instead, data is acquired from a series of slices and a two dimensional projection image lying in the x-z plane is produced as shown at 40. The magnitude and phase of the NMR signal at any point in this projection image 40 is determined by the sum, or line integral, of all the excited spins located along a line parallel to the y axis which passes through the x,z point. It can be appreciated, however, that the orientation of the slices 1 and, therefore, the orientation of the projection images 40 can be changed by altering the orientation of the applied magnetic field gradient.

Referring again to FIGS. 3A-3C, to produce an angiogram, the pulse sequence of FIG. 3A is sensitized to motion as taught by U.S. Pat. No. Re 32,701. More specifically, bi-polar velocity encoding gradient pulses $G_m$ are added to each pulse sequence along one of its gradient axes. These velocity encoding gradient pulses are produced by the same coils 8-10 that produce the position encoding gradients $G_x$, $G_y$, and $G_z$. These bi-polar motion encoding gradient pulses ($G_m$) are shown in FIGS. 3B and 3C, where the first moment ($M_1$) of the motion encoding pulses $G_m$ in FIG. 3B is equal to the area (A) of each pulse 45 and 46 multiplied by the time interval (t) between the pulses 45 and 46 (i.e. $M_1 = At$). The motion encoding pulses $G_m$ in FIG. 3C have the saem area and time interval, but they have opposite polarity and have a first moment equal to $-M_1$.

The motion encoding gradient pulses $G_m$ are added to the pulse sequence of FIG. 3A to sensitize it to velocity along one of the three axes. It is added to the slice select gradient as indicated by dashed lines 47 to measure the velocity of moving spins along the conventional slice select axis (z-axis), it is added to the readout gradient as indicated by dashed lines 48 to measure the velocity of moving spins along the readout axis (x-axis), and it is added to the phase encoding gradient as indicated by dashed lines 49 to measure the velocity of moving spins along the phase encoding axis (y-axis). As will now be explained, the NMR pulse sequence is repeated six times with the motion encoding gradient $G_m$ applied separately along each axis and it is executed twice for each axis, first with the positive motion encoding gradient $G_m$ of FIGS. 3B and then with the negative motion encoding gradient $G_m$ of FIG. 3C.

The order in which NMR data is acquired during the scan is illustrated in FIG. 4. As the cardiac cycles occur during the scan, three cardiac cycles are used to acquire NMR data for each slice. The NMR pulse sequence used during the first cardiac cycle employs a motion encoding gradient $G_m$ along the readout direction (x-axis), the NMR pulse sequence used during the second cardiac cycle employs a motion encoding gradient $G_m$ along a phase encoding axis (y-axis) and the third cycle employs a motion encoding gradient $G_m$ along the slice select axis (z-axis). After each set of three cardiac cycles, the center frequency of the RF excitation pulse 30 is changed to select the next slice and the three cycle acquisition repeats. When data for the last slice (#n) has been acquired, the scan is complete.

Referring still to FIG. 4, there is ample time during each cardiac cycle to acquire data for many images. The number (N) of images which are produced is determined by the subject's heart rate, and the data for each image 1 through N is acquired at the same point, or phase, of the cardiac cycle. The QRS pulse 25 initiates the sequence and a pair of pulse sequences (+M and −M) are executed for each of the N images. Since the data for each image is acquired at substantially the same point in each of the cardiac cycles, the anatomical structures are captured at substantially the same position in each image. As a result, the images are clear, and when viewed in order, they show the cardiovascular system as a sequence of angiograms at successive phases of the cardiac cycle.

An alternative data acquisition sequence which produces twice the number of images N during a cardiac cycle is also possible. In this alternative sequence, positive motion encoding (+M) is applied along an axis (x, y or z) during one cardiac cycle and a negative motion encoding gradient (−M) is applied during the next cardiac cycle. Two cardiac cycles are thus required for each axis, and a total of six cardiac cycles are required for each slice. However, the +M and −M can be acquired at precisely the same point in successive cardiac cycles and twice as many pulse sequences can be executed to double the number N of images acquired during a cardiac cycle.

Figure 6A:
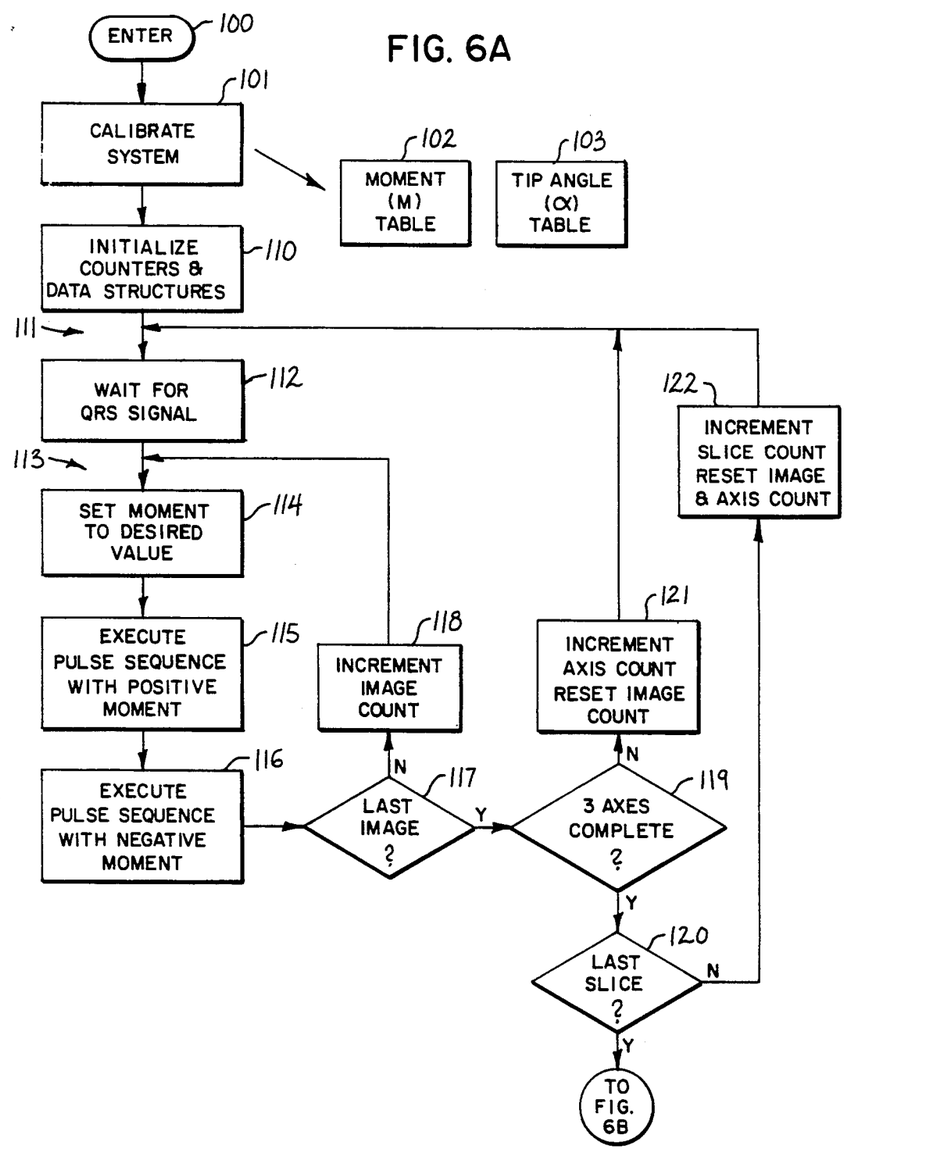
FIGS. 6A and 6B are a flowchart of the program executed by the NMR system of FIG. 2 to carry out the preferred embodiment of the invention.
Figure 6B:
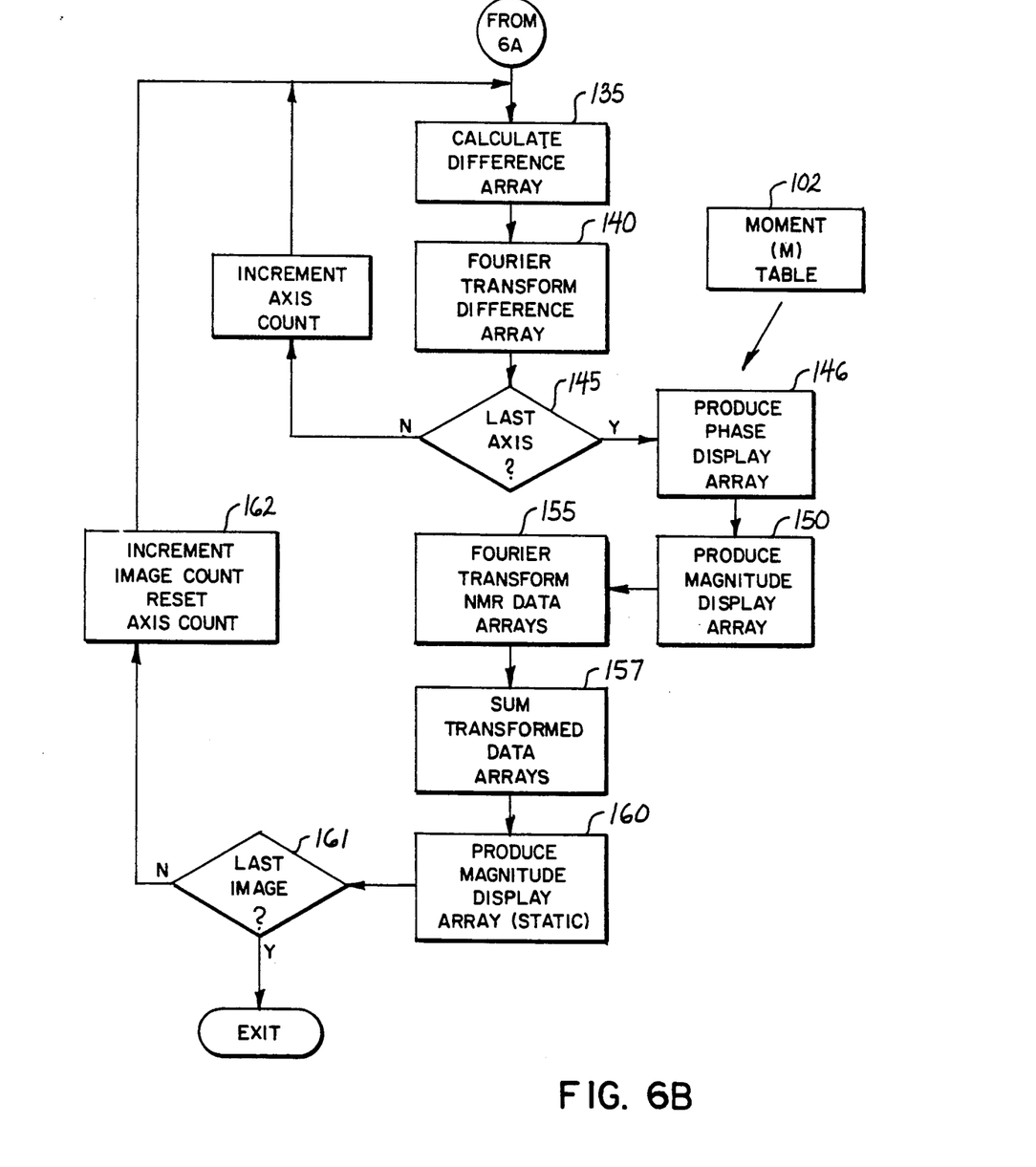

The present invention is carried out under the direction of a program which is executed by the computer 4. A flow chart of this program is shown in FIGS. 6A and 6B and it is executed when an angiogram is to be produced. The program is entered at 100 and it executes a number of prescan procedures which are indicated collectively at process block 101. These include calibrating the RF power and frequency so that precise tip angles can be produced. The calibration process also includes producing a moment table 102 and a tip angle table 103. These tables 102 and 103 are produced in a calibration procedure which includes executing the pulse sequence of FIG. 3A for three cardiac cycles. The first cycle is performed with an x-axis velocity sensitizing bipolar gradient $G_m$, the second cycle sensitizes to y-axis velocity and the third cardiac cycle sensitizes to z-axis velocity. The NMR data is acquired from a central slice through the region of interest and from this data a velocity profile, such as that shown by the curve 105 in FIG. 4 is calculated. For each interval 1 through N during which successive image data is acquired during a cardiac cycle, a gradient moment magnitude value M is stored in the moment table 102. As shown at 106 in FIG. 4, these values M are determined by the absolute magnitude of the velocity curve 105, such that the gradient moment M is smallest at high blood velocities to prevent aliasing and is highest at low blood velocities to improve the contrast in the angiogram. The tip angle table 103 is produced by storing a series of values which indicate the amplitude of the RF excitation pulse 30. Typically, as blood velocity decreases during diastole the tip angle may be reduced to prevent RF saturation of slow flowing spins. This feature is more important when the thickness of the slice is increased and spins remain in the slice for longer periods of time.

Referring again to the flow chart in FIGS. 6A and 6B, after system calibration the data structures and counters are initialized at process block 110 and a loop is entered at 111 in which the NMR data is acquired for each slice. The process waits for the next QRS pulse in the ECG signal as indicated at process block 112, and then a second loop is entered at 113 in which NMR data is acquired for each image. In the loop 113 the moment M of the bipolar motion encoding gradient $G_m$ is set at process block 114. This is done by using the image number, or count, as an index into the moment table 102 and setting the amplitude of the bipolar gradient pulses to the indicated magnitude. The pulse sequence of FIG. 3A is then executed twice as indicated by process blocks 115 and 116. The moment M of the motion encoding gradient $G_m$ is positive in the first pulse sequence and it is negative in the second pulse sequence. In addition, the direction (x, y or z axis) of the motion encoding gradient $G_m$ is determined by an axis counter. A test is then made at decision block 117 to determine if the data for all N images has been acquired during the current cardiac cycle. If not, the image count is incremented at 118 and the system loops back to acquire NMR data for the next image.

When data for all N images has been acquired during a cardiac cycle checks are made at decision block 119 and 120 to determine what data will be acquired during the next cardiac cycle. If motion sensitized NMR data has not been acquired for all three axes for the current slice, the axis count is incremented and the image count is reset at process block 121 before the system loops back. On the other hand, when NMR data sensitized in all three directions has been acquired the test is made at decision block 120 to determine if data for another slice is to be acquired. If so, the slice count is increased and the image count and axis count are reset as indicated at process block 122 before looping back to acquire more data. When data for all n slices has been acquired, the data acquisition phase of the procedure is complete and the image reconstruction begins.

Figure 5:
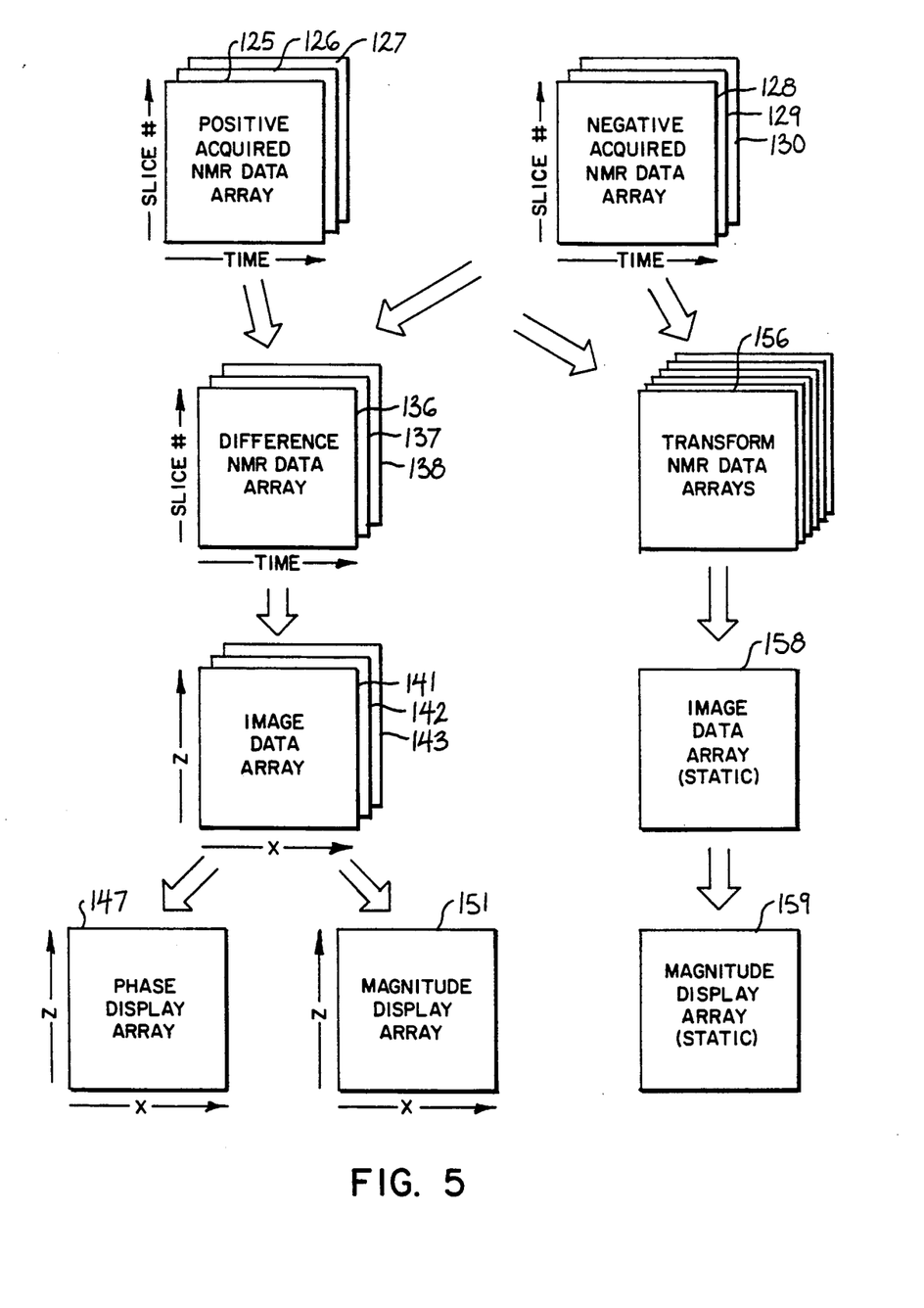
FIG. 5 is a schematic representation of the NMR data which is acquired and the manner in which it is processed to produce an image.

The NMR data acquired for one of the n images is illustrated in FIG. 5. It includes three n×m arrays 125, 126 and 127 of NMR data which have been velocity sensitized with a positive moment M and three n×m arrays 128, 129 and 130 of NMR data which have been velocity sensitized with a negative moment −M. The number of rows n corresponds to the number of slices acquired, and the number of columns m corresponds to the number of digitized samples of each acquired NMR signal. In the preferred embodiment n=42 and m=256.

Referring to FIGS. 5 and 6B, image reconstruction according to the present invention begins at process block 135 by subtracting the complex numbers in the negative arrays 128, 129 and 130 from their corresponding complex numbers in the positive arrays 125, 126 and 127 to produce three n×m difference arrays 136, 137 and 138. It can be appreciated that the NMR signal components produced by stationary spins are the same in both the positive and negative arrays and this subtraction step will, therefore, substantially null the signal component due to the stationary spins. On the other hand, the NMR signal components due to moving spins are subjected to a phase shift which is positive in the arrays 125, 126 and 127 and is negative in the arrays 128, 129 and 130. As a result of the subtraction, therefore, the NMR signal components due to moving spins add together to enhance their signal strength in the difference arrays 136, 137, and 138. It is this step which enables the cardiovascular system to be sharply contrasted with surrounding tissue in the final angiogram, because it is the cardiovascular system which contains the rapidly moving spins in the form of blood.

As indicated at process block 140, the next step is to Fourier transform the respective difference arrays 136, 137 and 138 along each row. As is well known in the art, this transforms the time domain signals on each row to the frequency domain, which in turn corresponds to the position along the readout axis (x-axis). The complex numbers in each of the three resulting n×m image data arrays 141, 142 and 143 indicate the number of spins moving along the respective x, y and z axes and the average velocity of the movement.

When all three axes have been transformed as determined at decision block 145, the process then proceeds to process block 146 to calculate the elements of an n×m phase display array 147. The phase angle indicated by each complex number in the n×m image data arrays 141, 142 and 143 is proportional to the average velocity of the spins along respective x, y and z axes at a point in the x-z projection plane.

$$\phi = \tan^{-1}(q/i)$$

Accordingly, by vectorially summing these three phase angles, a value proportional to the average spin velocity is calculated for each point in the n×m phase display array.

$$\phi_v = \sqrt{\phi_x^2 + \phi_y^2 + \phi_z^2}$$

Because each image is obtained with a different value of bipolar velocity encoding gradient $G_m$, the values in the phase display array must be normalized using the first moment value M corresponding to this image in the moment table 102. As a result, when all of the phase display images are viewed, they will all accurately reflect the velocity of blood flow by the brightness of each pixel on the display screen, even though the NMR data for each image may have been acquired with a different velocity sensitizing gradient moment M.

Next, as indicated by process block 150, an n×m magnitude display array 151 is calculated. This is accomplished by first calculating the magnitude (D) of each complex number in each of the image data arrays 141, 142 and 143.

$$D = \sqrt{i^2 + q^2}$$

where: i and q are the real and imaginary components of the complex numbers

Then, these magnitudes $D_x$, $D_y$ and $D_z$ for each axis are vectorially summed at each of the n×m data points to produce a number $D_v$ which represents the magnitude of the NMR signals produced by moving spins:

$$D_v = \sqrt{D_x^2 + D_y^2 + D_z^2}$$

The resulting magnitude display array 151 is stored in the computer memory and may be recalled after the procedure has finished to produce an angiogram display. Of course, a series of such images are stored by the present procedure, and these may be displayed in sequence to show the changes in the cardiovascular system during an entire cardiac cycle.

The remainder of the procedure uses the acquired NMR data to produce a conventional spin density image. Referring again to FIGS. 5 and 6B, this is accomplished by Fourier transforming arrays 125–130 along each of their rows as indicated at process block 155. Six n×m transformed NMR data arrays 156 are thus produced. Then, the corresponding complex numbers in each of the six arrays 156 are added together at process block 157 to form a single, n×m image data array 158. A magnitude display array 159 is then produced and stored at process block 160 by calculating the square root of the sum of the squares of the complex number components in the static image array 158. When displayed, this data reveals the density of the stationary spins in the projection plane and it is used to locate vessels with respect to stationary anatomical structures. For example, the radiologist can superimpose the angiogram image produced from either the phase display array 147 or the magnitude display array 151 on the image produced by the static magnitude display array 159 to precisely locate a particular vessel in the patient.

The process is repeated for each of the N images that are acquired during the cardiac cycle. When the last image N has been processed as determined at decision block 161, the process is complete, otherwise, it loops back through block 162 to process the next image. At the conclusion of the scan, the computer stores three display arrays 147, 151, and 159 for each of the N images that are acquired during a cardiac cycle. These can be looked at separately, played back in sequence or combined in any diagnostically useful manner.

We claim:

1. In an NMR system a method for measuring the velocity of blood in a patient, the steps comprising:
    (a) generating a cardiac phase signal which indicates the phase of the patient's cardiac cycle;
    (b) producing a polarizing magnetic field around the region in which blood velocity is to be measured;
    (c) generating an RF excitation field in said region to produce transverse magnetization;
    (d) calculating the first moment M of a bi-polar magnetic field gradient as a function of the phase of the patient's cardiac cycle as determined by said cardiac phase signal;
    (e) generating a bi-polar magnetic field gradient in said region which has the first moment M and which velocity sensitizes the transverse magnetization;
    (f) acquiring an NMR signal produced by the velocity sensitized transverse magnetization;
    (g) repeating steps (b), (c), (e) and (f) with the sign of the bi-polar magnetic field gradient moment M reversed; and
    (h) producing output data which is indicative of the velocity of moving spins in the region by subtracting the two acquired NMR signals to generate difference data.

2. The method as recited in claim 1 which further includes:
    (i) applying a magnetic field gradient to the region to position encode the acquired NMR signal and to thereby
    indicate the position of moving spins in the region.

3. The method as recited in claim 1 in which step (h) includes:
    adjusting the value of the output data as a function of the calculated first moment M.

4. The method as recited in claim 1 which includes estimating the velocity of blood in the region at different phases of the patient's cardiac cycle, and the first moment M is calculated in step (d) as a function of the estimated velocity at the cardiac phase indicated by said signal.

5. The method as recited in claim 1 in which the RF excitation field is altered as a function of the patient's cardiac cycle as determined by said cardiac phase signal to change the amount of transverse magnetization which is produced as a function of the cardiac cycle phase.

6. In an NMR system a method for producing an angiogram of a patient, the steps comprising:
    (a) generating a cardiac phase signal which indicates the phase of the patient's cardiac cycle;
    (b) producing a polarizing magnetic field around the region in which an angiogram is to be produced;
    (c) generating an RF excitation field in said region to produce transverse magnetization;
    (d) calculating the first moment M of a bi-polar magnetic field gradient as a function of the phase of the patient's cardiac cycle as determined by said cardiac phase signal;
    (e) generating a bi-polar magnetic field gradient in said region which has the first moment M and which velocity sensitizes the transverse magnetization;

(f) acquiring a first NMR signal produced by the velocity sensitized transverse magnetization while applying a readout magnetic field gradient in said region;

(g) repeating steps (b) and (c);

(h) generating a bi-polar magnetic field gradient in said region which has a negative first moment −M and which velocity sensitizes the transverse magnetization;

(i) acquiring a second NMR signal produced by the velocity sensitized transverse magnetization while applying a readout magnetic field gradient in said region;

(j) producing a difference signal by finding the difference between the first and second NMR signals;

(k) Fourier transforming the difference signal to produce an output signal; and (l) using the output signal to produce an angiogram display.

7. The method as recited in claim 6 in which the RF excitation field is generated while a slice select magnetic field gradient is produced in the region such that the transverse magnetization is produced in a slice through the region; and in which steps (a) through (l) are repeated to acquire first and second NMR signals from a different slice and to produce a corresponding display of both slices.

* * * * *